United States Patent
Liu et al.

(10) Patent No.: US 10,442,680 B2
(45) Date of Patent: Oct. 15, 2019

(54) ELECTRIC CONNECTION FLEXURES

(71) Applicant: MEMS DRIVE, INC., Arcadia, CA (US)

(72) Inventors: Xiaolei Liu, South Pasadena, CA (US); Kegang Huang, Fremont, CA (US); Guiqin Wang, Arcadia, CA (US); Matthew Ng, Rosemead, CA (US); Benson Mai, Alhambra, CA (US); Changgeng Liu, Arcadia, CA (US)

(73) Assignee: MEMS Drive, Inc., Arcadia, CA (US)

( * ) Notice: Subject to any disclaimer, the term of this patent is extended or adjusted under 35 U.S.C. 154(b) by 419 days.

(21) Appl. No.: 15/182,389

(22) Filed: Jun. 14, 2016

(65) Prior Publication Data
US 2017/0359003 A1    Dec. 14, 2017

(51) Int. Cl.
  *H02N 2/02* (2006.01)
  *B81B 3/00* (2006.01)
  *H01L 41/09* (2006.01)

(52) U.S. Cl.
  CPC ........ *B81B 3/0062* (2013.01); *H01L 41/0993* (2013.01); *H02N 2/028* (2013.01); *B81B 2203/019* (2013.01); *B81B 2203/0109* (2013.01); *B81B 2203/0163* (2013.01); *B81B 2203/053* (2013.01)

(58) Field of Classification Search
  CPC .... H02N 2/028; H02N 1/006; H01L 41/0933; H04N 5/2254; B81B 3/0018; B81B 3/0051; B81B 3/007
  USPC .......................... 310/330–332; 257/414–416
  See application file for complete search history.

(56) References Cited

U.S. PATENT DOCUMENTS

| | | | |
|---|---|---|---|
| 6,091,050 A * | 7/2000 | Carr | H05B 1/0216 219/201 |
| 6,389,899 B1 | 5/2002 | Partridge | |
| 2005/0202585 A1 | 9/2005 | Eskridge | |
| 2012/0120507 A1 | 5/2012 | Gutierrez et al. | |
| 2012/0286378 A1 | 11/2012 | Lee et al. | |
| 2013/0181893 A1 | 7/2013 | Black | |
| 2013/0285164 A1* | 10/2013 | Saito | B81B 3/0018 257/415 |
| 2013/0341735 A1* | 12/2013 | Eskridge | B81B 7/0051 257/415 |
| 2015/0049155 A1* | 2/2015 | Morikawa | G02B 26/0841 347/260 |
| 2015/0341534 A1 | 11/2015 | Ng et al. | |

OTHER PUBLICATIONS

International Search Report and Written Opinion dated Oct. 10, 2017 in counterpart International Application numbered PCT/US2017/037127.

* cited by examiner

*Primary Examiner* — Derek J Rosenau
(74) *Attorney, Agent, or Firm* — Brian J. Colandreo; Michael T. Abramson; Holland & Knight LLP

(57) ABSTRACT

Electric connection flexures for moving stages of microelectromechanical systems (MEMS) devices are disclosed. The disclosed flexures may provide an electrical and mechanical connection between a fixed frame and a moving frame, and are flexible in the moving frame's plane of motion. In implementations, the flexures are formed using a process that embeds the two ends of each flexure in the fixed frame and moving frame, respectively.

5 Claims, 15 Drawing Sheets

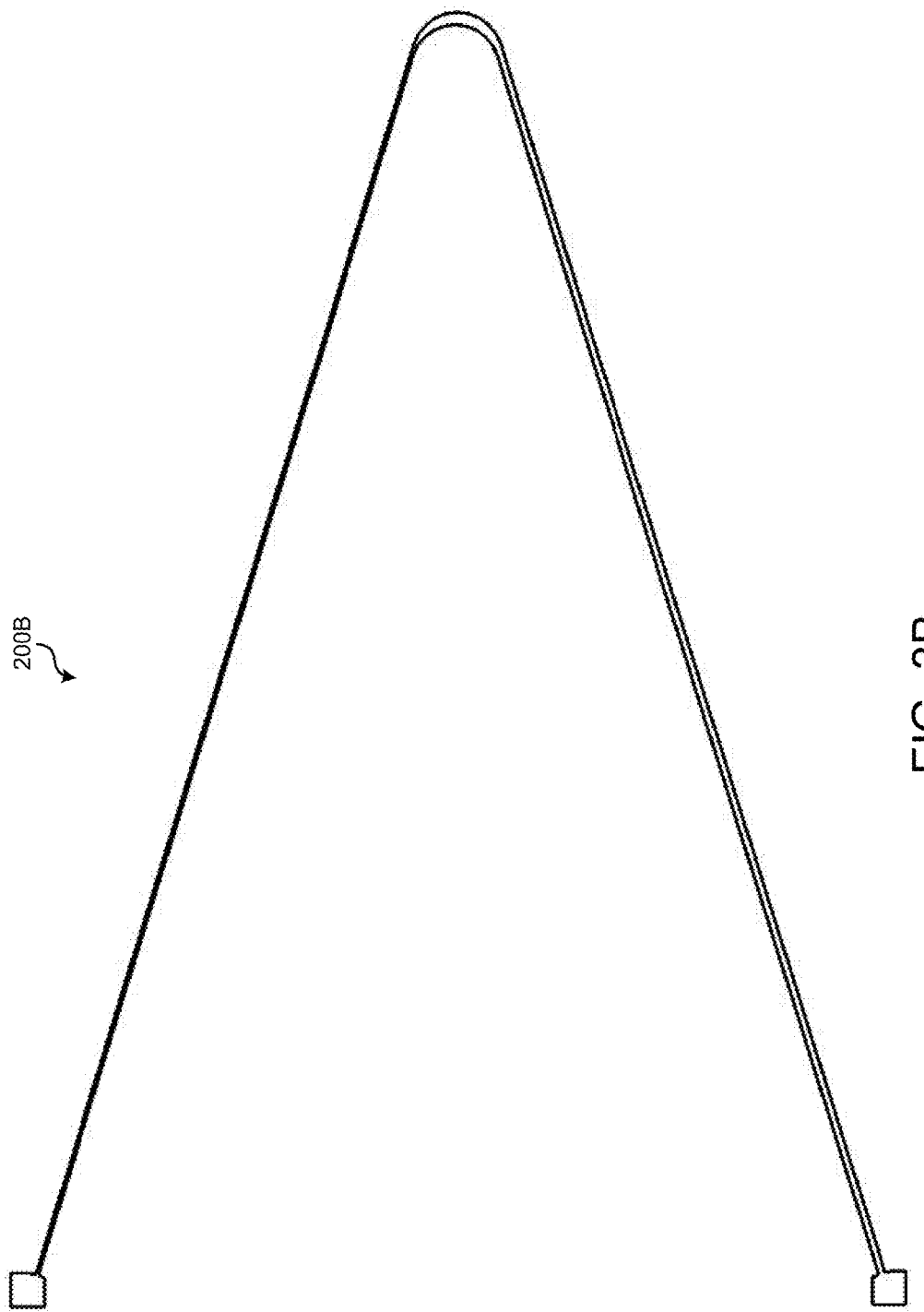

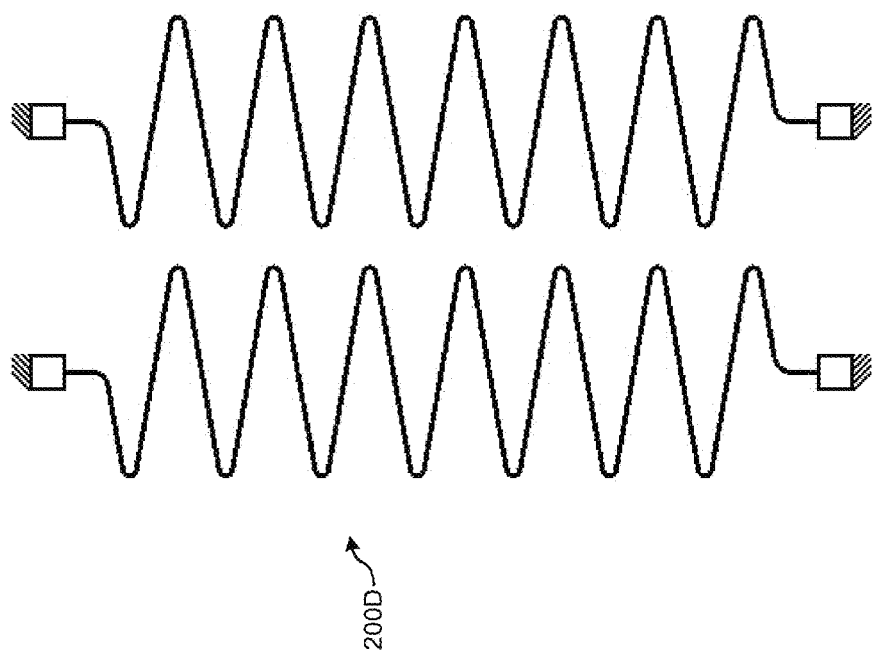

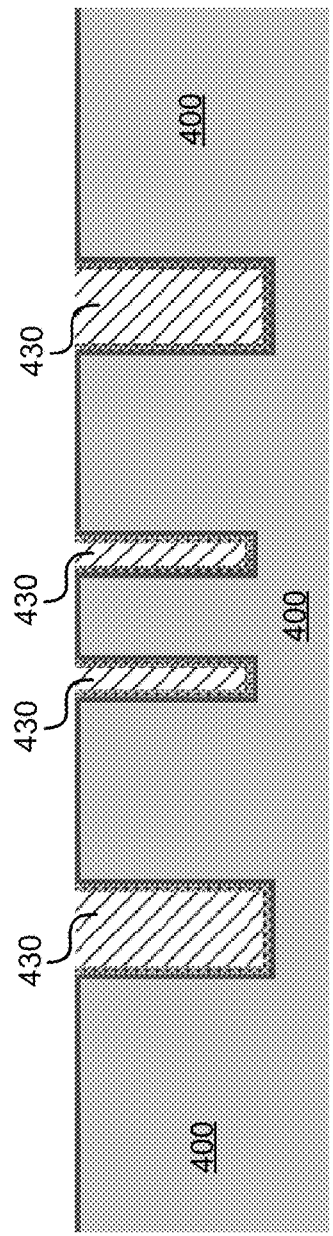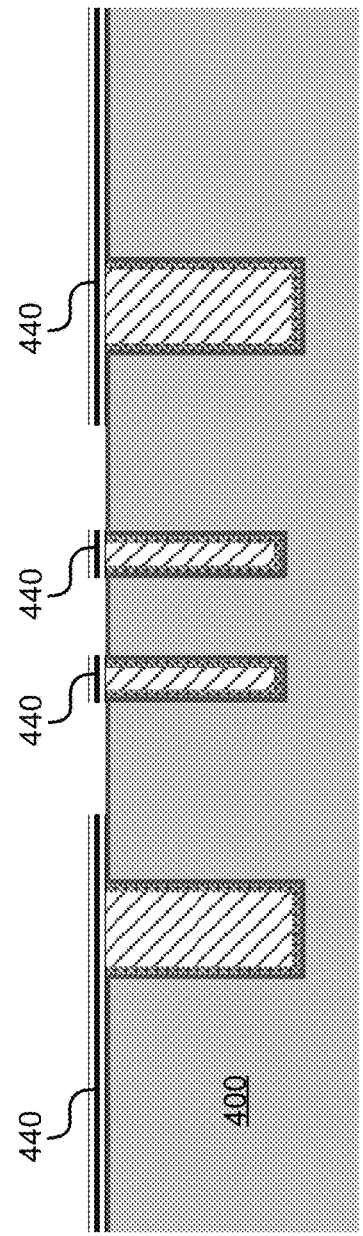

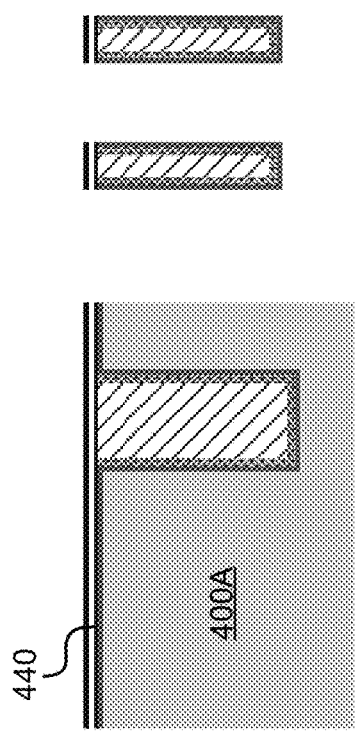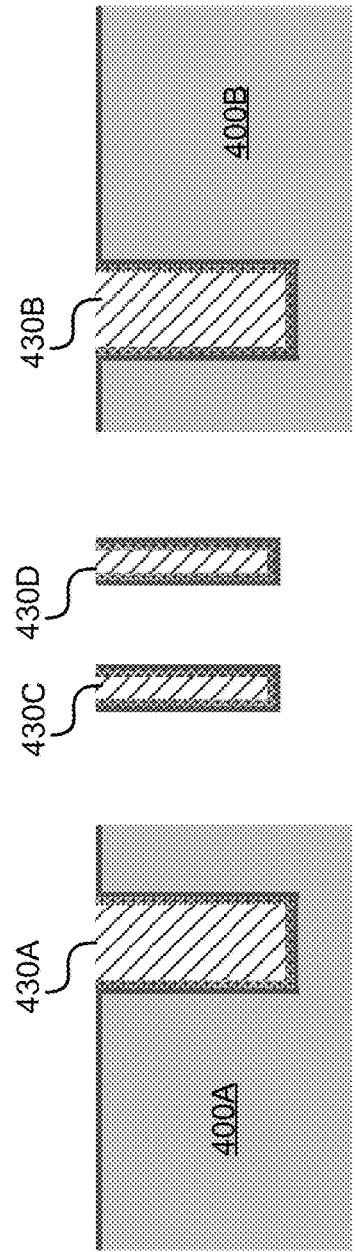

ELECTRIC CONNECTION FLEXURES

TECHNICAL FIELD

The present disclosure relates generally to flexures for microelectromechanical systems (MEMS), and more particularly, embodiments relate to electric connection flexures for moving stages.

BRIEF SUMMARY OF THE DISCLOSURE

In accordance with various embodiments of the technology disclosed herein, electric connection flexures for moving stages of microelectromechanical systems (MEMS) devices are disclosed. The disclosed flexures have low electrical resistance and stiffness, and displace sufficiently such that a moving stage (e.g., a stage carrying a sensor), may freely move in at three degrees of freedom relative to a fixed circuit board while maintaining an electrical connection with the circuit board. The two ends of the flexure may be embedded in respective frames that displace relative to one another such that out of plane motion relative to the moving stage may be limited and a moving stage assembly may be designed more compactly.

In a first embodiment of the technology disclosed herein, an actuator includes: an outer frame; an inner frame; and a flexure electrically and mechanically coupling the outer frame to the inner frame. The flexure includes a first end embedded in the outer frame; a second end embedded in the inner frame; and a body extending from the first end to the second end. In implementations the flexure comprises a metal or metal alloy, and the outer and inner frames comprise silicon.

In a particular implementation, the actuator includes a circuit board and a sensor, the outer frame is bonded on the circuit board, and the inner frame is electrically and mechanically coupled to a moving stage including the sensor. In this implementation, the flexure may electrically connect the circuit board to the sensor.

In a second embodiment of the technology disclosed herein, a method of forming a moving platform assembly includes: forming a plurality of trenches in a substrate including silicon, the plurality of trenches including: a first trench corresponding to a first end of a flexure, a second trench corresponding to a second end of the flexure, and a third trench corresponding to a body of the flexure; plating the trenches with a conductive material; and removing the silicon around the body of the flexure. By removing the silicon around the body of the flexure, the flexure is released, where the flexure includes a first conductive end embedded in a first silicon structure, a freestanding conductive body, and a second conductive end embedded in a second silicon structure. In implementations, the plating material is a metal or metal alloy such as copper, the depth of the third trench is between 5 micrometers and 50 micrometers, and the width of the third trench is between 0.5 micrometers and 10 micrometers.

In further implementations, the method additionally includes: depositing a photoresist pattern layer over the plated trenches, the pattern of the photoresist pattern layer corresponding to the shape of the flexure. In yet further implementations, the method additionally includes: depositing oxide and polysilicon layers in the trenches before plating the trenches.

As used herein, the term "about" in quantitative terms refers to plus or minus 10%. For example, "about 10" would encompass 9-11. Moreover, where "about" is used herein in conjunction with a quantitative term it is understood that in addition to the value plus or minus 10%, the exact value of the quantitative term is also contemplated and described. For example, the term "about 10" expressly contemplates, describes and includes exactly 10.

The terms "over," "under," "between," and "on" as used herein refer to a relative position of one media layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. By contrast, a first layer "on" a second layer is in contact with that second layer. Additionally, the relative position of one layer with respect to other layers is provided assuming operations are performed relative to a substrate without consideration of the absolute orientation of the substrate.

Other features and aspects of the disclosure will become apparent from the following detailed description, taken in conjunction with the accompanying drawings, which illustrate, by way of example, the features in accordance with various embodiments. The summary is not intended to limit the scope of the invention, which is defined solely by the claims attached hereto.

BRIEF DESCRIPTION OF THE DRAWINGS

The disclosed technology, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

FIG. 3B illustrates an example electric connection flexure that may be used in embodiments of the technology disclosed herein.

FIG. 3D illustrates an example electric connection flexure that may be used in embodiments of the technology disclosed herein.

FIGS. 5A-5H are cross-sectional diagrams illustrating the device of FIG. 4 after various process operations.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION

In accordance with various embodiments of the disclosed technology, conductive electric connection flexures for moving stages of microelectromechanical systems (MEMS) devices are disclosed. The disclosed flexures may provide an electrical connection between a moving stage and a printed circuit board (PCB) that the stage moves relative to. For example, in some embodiments the flexures may provide an electrical connection between a moving image sensor, display chip, or other optoelectronic devices and a PCB. The disclosed flexures are designed to have low electrical resistance, low stiffness, and displace sufficiently such that a moving stage (e.g., a stage carrying a sensor), may freely move in at three degrees of freedom relative to a fixed circuit board while maintaining an electrical connection with the circuit board.

In embodiments, the flexures may be formed using a process that embeds the two ends of the flexure in respective frames that displace relative to one another (e.g., a moving platform and fixed frame). For example, the flexure ends may be embedded in the silicon material of the frames as opposed to being coupled to the surface of the frames. By embedding the ends of the flexure, out of plane motion relative to the moving platform may be limited and a moving platform assembly may be designed more compactly.

Figure 1:
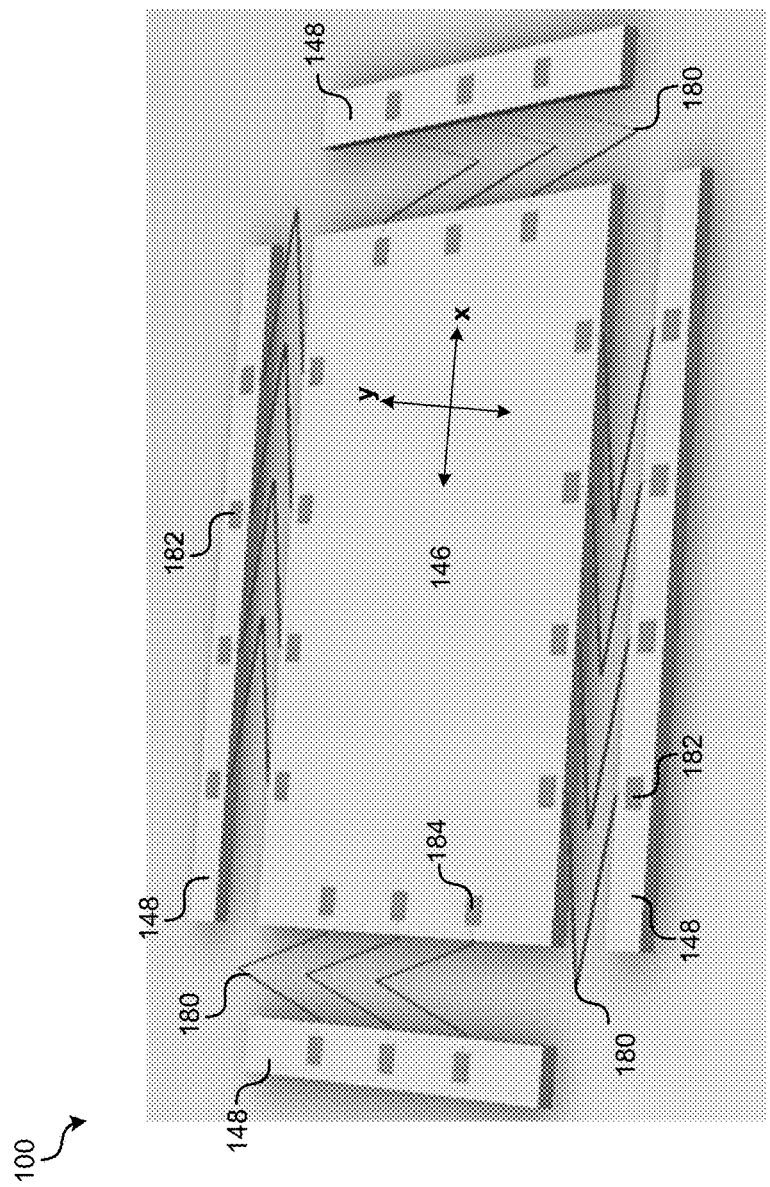
FIG. 1 illustrates an example multi-dimensional actuator including electric connection flexures, in accordance with embodiments of the technology disclosed herein.

Before describing the disclosed conductive flexures in detail, it is useful to describe an example device in which they may be implemented. FIG. 1 illustrates one such example device, a multi-dimensional actuator 100, in accordance with embodiments of the present disclosure. As illustrated in this embodiment, actuator 100 includes an outer frame 148 connected to inner frame 146 by one or more flexures 180. The outer frame 148, in various embodiments, may be bonded on a PCB (not shown) using epoxy, solder, or other suitable bonding mechanism. Although outer frame 148 is divided into four sections in this implementation, in other implementations it may be a single frame piece.

The inner frame 146, as a moving stage in various embodiments, may be electrically and mechanically connected to an electronic or optoelectronic device such as a sensor (not shown). The sensor may be an image sensor, such as a charge-coupled-device (CCD) or a complementary-metal-oxide-semiconductor (CMOS) image sensor. During operation, actuators (not shown) may drive movement of the moving stage in the X and Y directions (plane of the stage) as shown in FIG. 1 and in a rotational direction (around Z).

Flexures 180 are electrically conductive and may be soft in in-plane movement degrees of freedom and stiff in out of plane movement degrees of freedom. With reference to FIG. 1, flexure 180 may be soft in the X and Y directions and stiff out of the plane. For example, the ratio between the stiffness in the Z direction (vertical to X-Y plane) and stiffness in the X or Y directions can be greater than 10 (e.g., the design shown in FIG. 3). Additionally each of the ends of flexure 180 may be embedded or attached in inner frame 146 and outer frame 148, respectively. Using embedded or attached flexures 180, i) a moving stage may be electrically connected to the PCB which is connected to the outer frame 148; ii) the moving stage may freely move in multiple degrees of freedom; and iii) flexure 180 may stay within the plane during relative motion between the frames. In example actuator 100, flexures 180 route electrical signals between electrical contact pads 182 (e.g., aluminum contact pads) on outer frame 148 to electrical contact pads 184 (e.g., aluminum contact pads) on inner frame 146.

Figure 2:
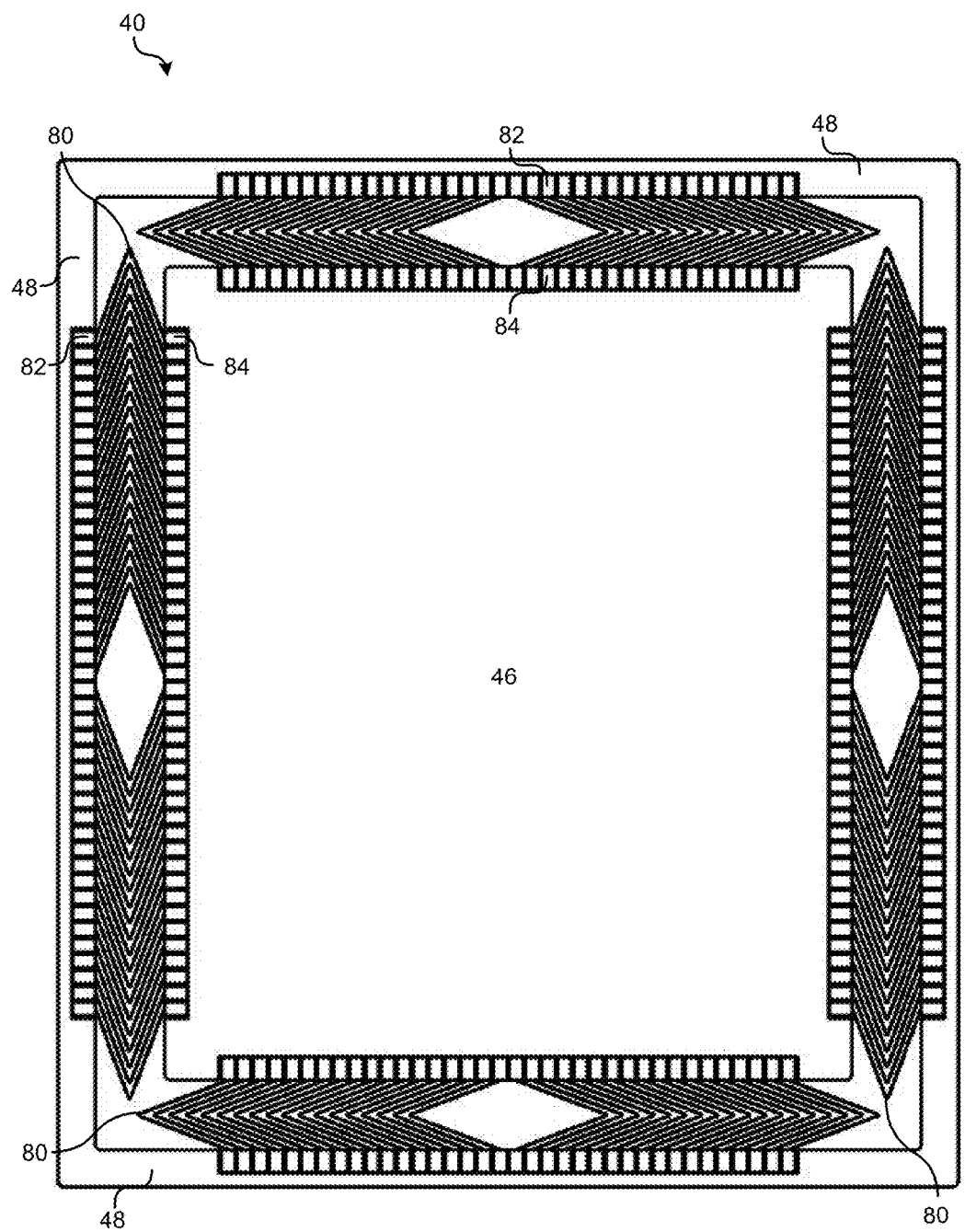
FIG. 2 illustrates a particular implementation of a multi-dimensional actuator, including an outer frame connected to an inner frame by one or more embedded electric connection flexures, in accordance with embodiments of the technology disclosed herein.

FIG. 2 illustrates a particular implementation of a multi-dimensional actuator 40, including an outer frame 48 connected to an inner frame 46 by one or more embedded conductive flexures 80. Embedded flexures 80 route electrical signals between surface electrical contact pads 82 on outer frame 48 to surface electrical contact pads 84 on inner frame 46. Some of these electrical signals may subsequently be routed to actuators inside the inner frame (not shown in FIG. 2).

The inner frame driven by actuators, in some cases, may move about +/−100 micrometers in plane, and flexures 80 may be designed to tolerate this range of motion without touching one another (e.g., so that separate electrical signals can be routed on the various spring elements 80). The maximum in plane moving range of the inner frame may depend on the specific application of the actuator, and in various embodiments, the maximum moving range may be between about 10 to about 200 micrometers. In embodiments, the inner frame may rotate up to about 2 degrees in plane.

In example actuator 40, comb drive actuators (not shown) may drive movement of a moving stage or platform (e.g., an image sensor) coupled to inner frame 46 or outer frame 48. For example, the comb drive actuators may apply a controlled force between inner frame 46 and a center anchor 42.

Figure 3A:
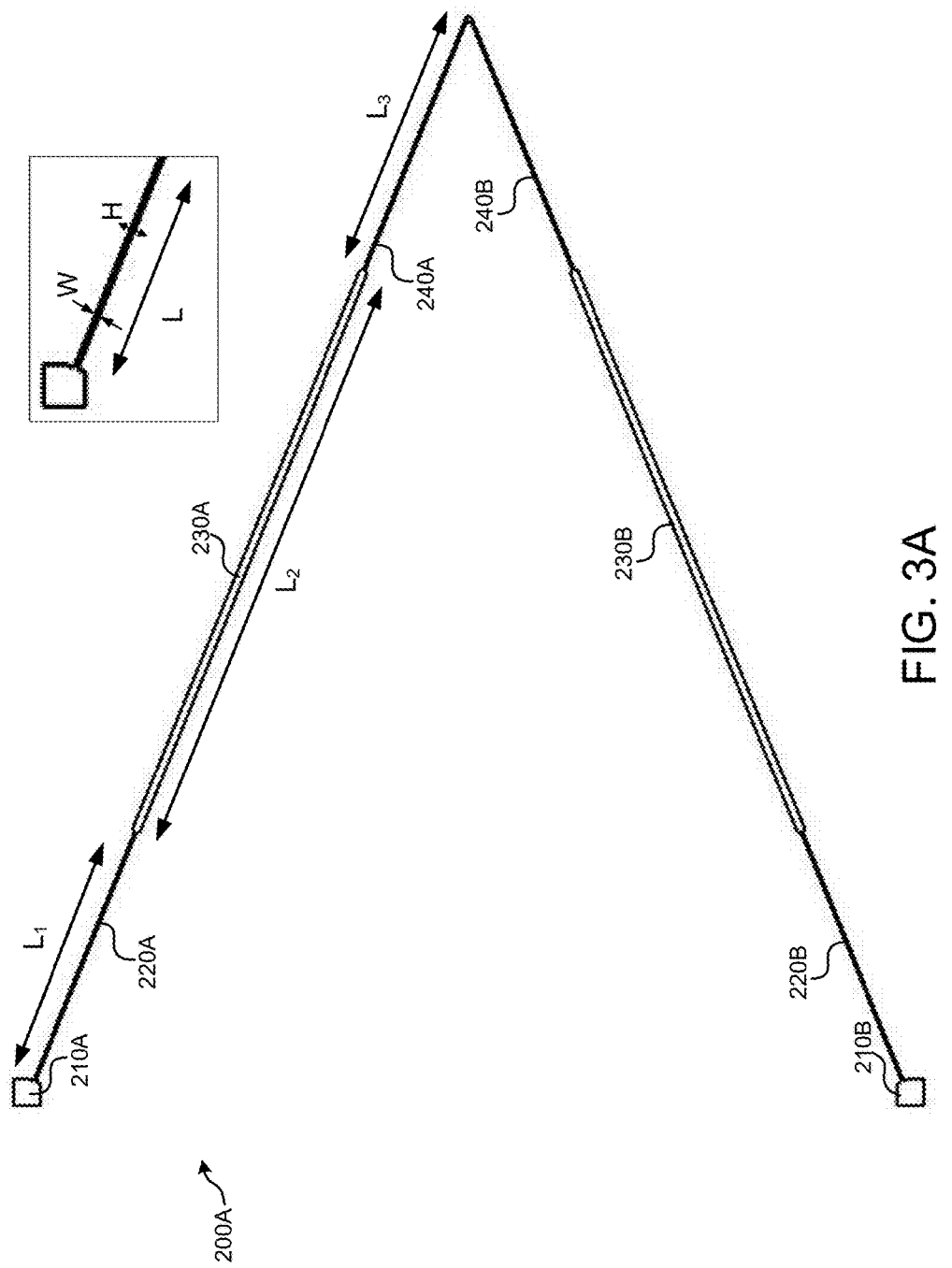
FIG. 3A illustrates an example electric connection flexure that may be used in embodiments of the technology disclosed herein.

FIG. 3A illustrates an example electric connection flexure 200A that may be used in embodiments of the technology disclosed herein. As illustrated, flexure 200A includes anchors or ends 210A-210B that are joined by a flexible body including portions 220A-220B, 230A-230B, and 240A-240B. During fabrication, further described below, ends 210A-210B may each be embedded or attached in a respective first frame (e.g., a moving silicon platform) or second frame (e.g., an outer silicon frame comprising electrical bars). In various embodiments, flexure 200A provides low stiffness in a tangential direction and radial direction to ends 210A-210B and high stiffness out of the plane of motion. Accordingly, an electrical and flexible connection may be established between the two frames from end 210A to end 210B. In various embodiments, flexure 200A may comprise a metal or metal alloy flexure (e.g., copper flexure) that provides high conductivity and ductility. In various embodiments, each of the two straight sections of the body of flexure 200A may have a length (L) of 200 to 1000 micrometers, a width (W) of 1 to 20 micrometers, and a height (H) of 5 to 50 micrometers.

As shown in this particular embodiment, flexure 200A has a "V"-shaped design formed by a body including two straight sections that couple at portions 240A and 240B from ends 210A and 210B. In this particular implementation, each straight section of the body of flexure 200A includes a thin section 220A-220B coupled to and extending from a respective end 210A-210B, a thick section 230A-230B coupled to and extending from a respective thin section 220A-220B, and a thin section 240A-240B coupled to and extending from a respective thick section 230A-230B. This design, in some embodiments, may improve the maximum stress flexure 200A may withstand as it travels in directions tangential to and radial to ends 210A-210B.

In various embodiments, the angle of the "V" and the lengths (L) and widths (W) of sections 220A-220B, 230A-230B and 240B are designed to fit geometric constraints, maximize conductivity, and minimize stiffness and stress of the deformed flexure. For example, in some embodiments the angle of the "V" shape can be between 20 and 120 degrees, the length $L_1$ of thinner sections 220A-220B may between 50 and 500 micrometers, the length $L_2$ of thicker sections 220A-220B may between 50 and 2000 micrometers, and the length $L_3$ of thinner sections 240A-240B may be between 50 and 500 micrometers. In some embodiments, the width of thinner sections 220A-220B and 240A-240B may be between 0.5 and 10 micrometers, and the width of thicker sections 230A-230B may be between two to five times the width of thinner sections 220A-220B.

Although illustrated in this example as having a particular configuration of varying widths along its straight sections, flexure 200 need not be limited to this particular configuration. For example, flexure 200 may instead be thicker at sections 240A-240B. As another example, the straight sections of flexure 200 may have more than one thick section or only one thin section. Additionally, flexure 200 may have a uniform width along the entirety of its straight sections. Further, the body of flexure 200 need not be limited to the particular geometric shape illustrated in FIG. 3. In some implementations, further illustrated below, flexure 200 may be, for example, W-shaped, serpentine shaped, S-shaped, L shaped, or Z-shaped.

Figure 3C:
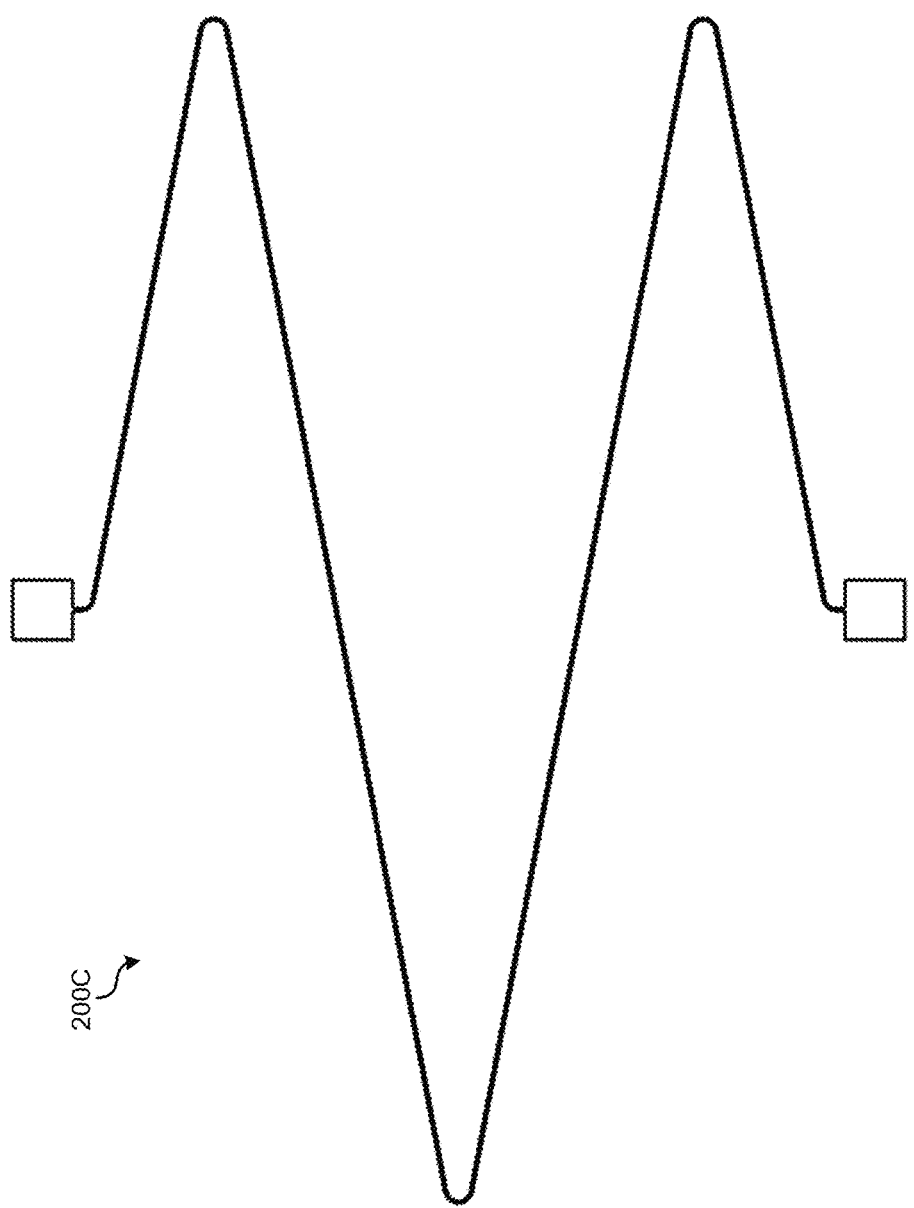
FIG. 3C illustrates an example electric connection flexure that may be used in embodiments of the technology disclosed herein.

FIG. 3B illustrates a design for another electric connection flexure 200B that may be used in implementations. In this implementation, flexure 200B has an asymmetric V-shape design with one straight section that is wider than the other straight section. FIG. 3C illustrates a W-shaped design for an electric connection flexure 200C that may be used in implementations.

Figure 3E:
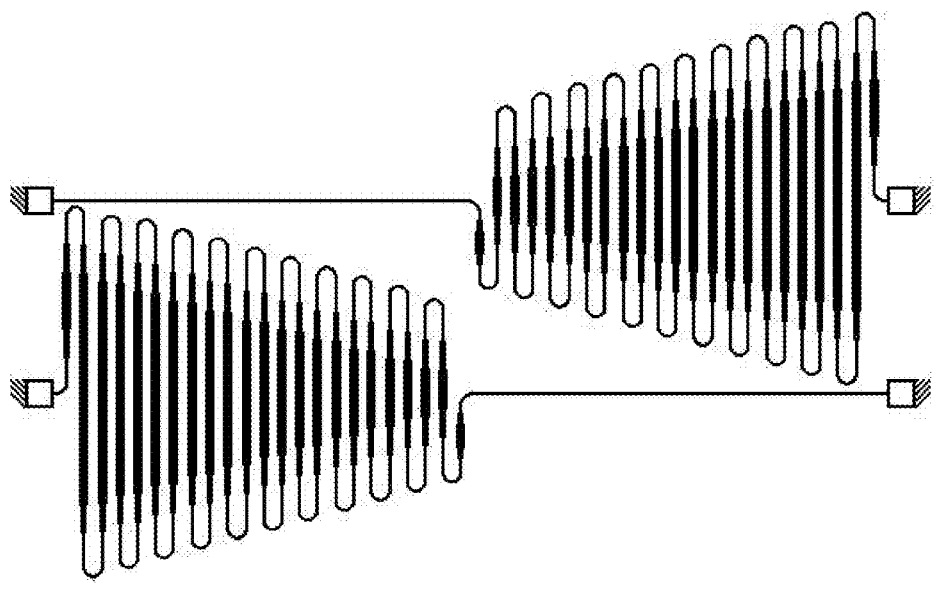
FIG. 3E illustrates an example electric connection flexure that may be used in embodiments of the technology disclosed herein.

FIG. 3D illustrates a serpentine-shaped design for a pair of adjacent flexures 200D that may be used in implementations. In this implementation, adjacent flexures 200D are parallel along their lengths from end to end. FIG. 3E illustrates an alternative serpentine-shaped design for a pair of adjacent flexures 200E that may be used in implementations. In this implementation, adjacent flexures 200E are inverted.

Figure 3F:
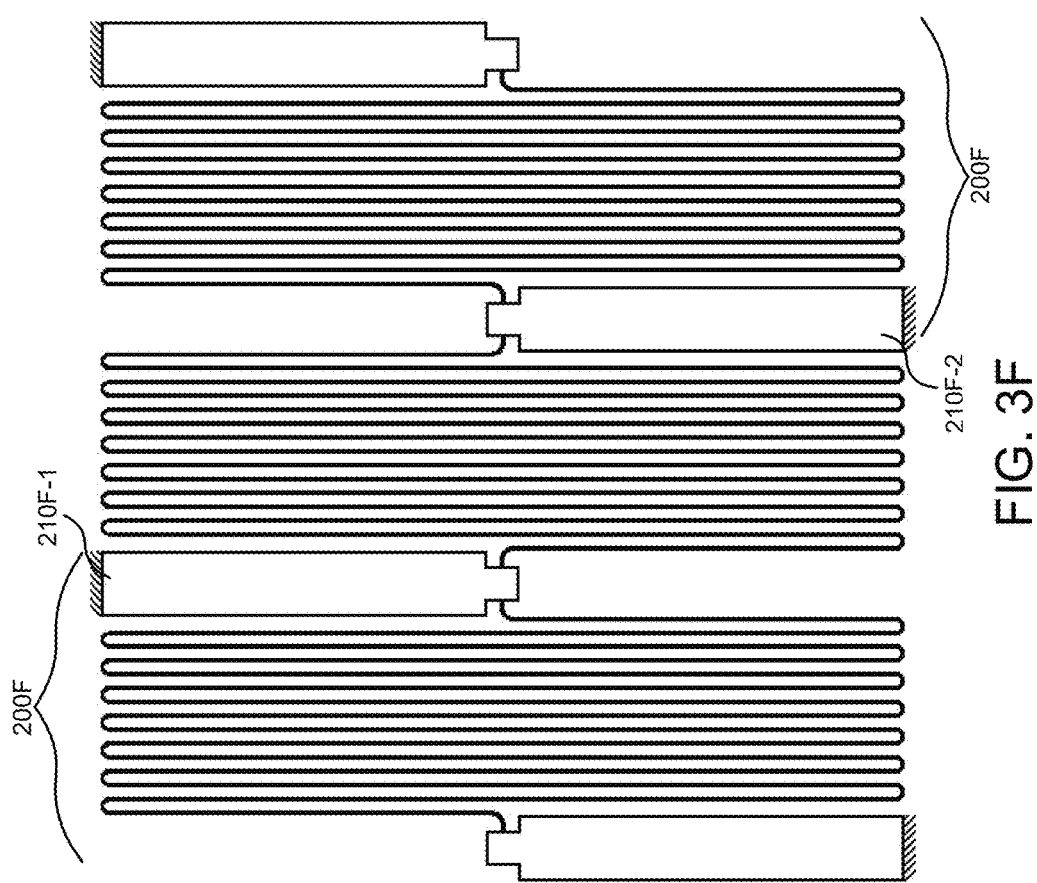
FIG. 3F illustrates an example electric connection flexure that may be used in embodiments of the technology disclosed herein.

FIG. 3F illustrates yet another serpentine-shaped design for a pair of adjacent flexures 200F that may be used in implementations. In this implementation, the ends of each flexure 200F are displaced horizontally from one another. Additionally, the closest ends 210F-1 and 210F-2 of adjacent flexures 200F are mechanically and electrically coupled together.

In embodiments, a single actuator may use a plurality of differently shaped electric connection flexures depending on geometric constraints and other design requirements. In some implementations, the conductive flexures may be designed to prevent contact with adjacent conductive flexures during maximum displacement or travel of the moving stage.

Figure 4:
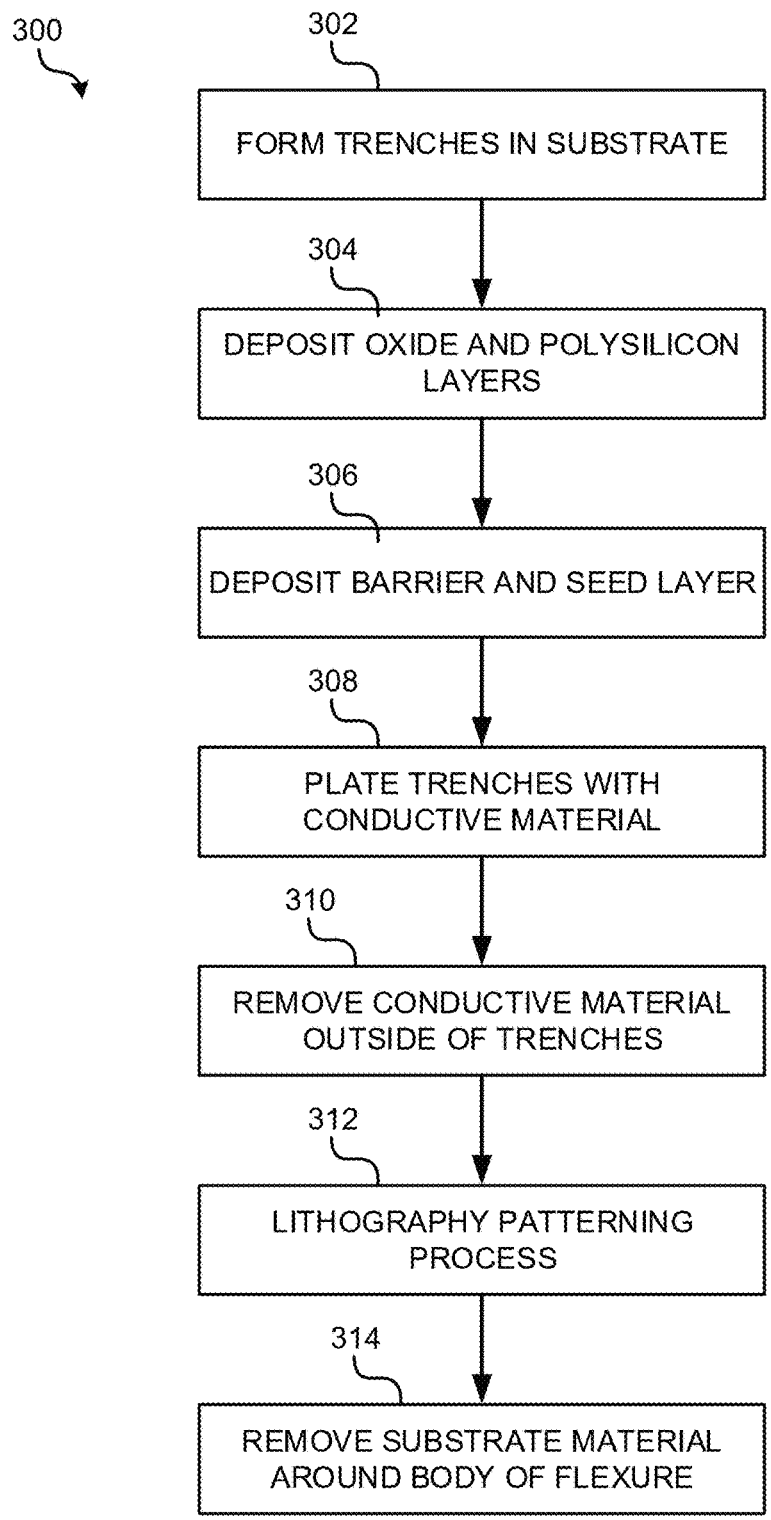
FIG. 4 is an operational flow diagram illustrating an example process for fabricating a device including a first frame coupled to a second frame by one or more conductive flexures with ends embedded in the frames, in accordance with embodiments of the technology disclosed herein.
Figure 5A:
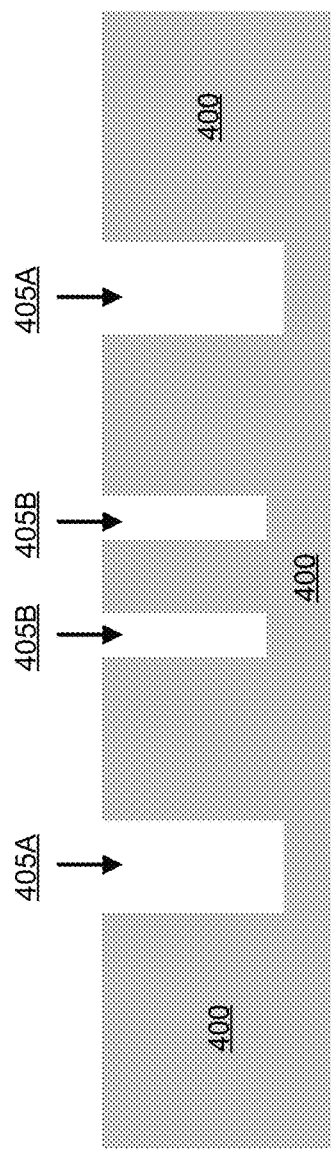
Figure 5B:
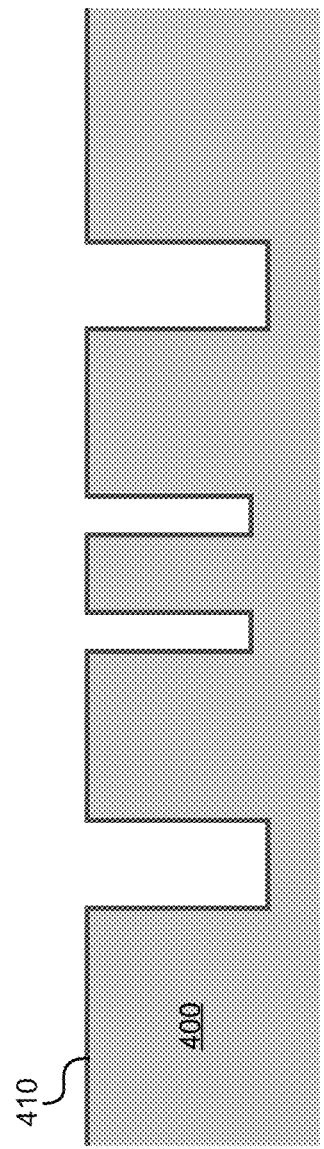
Figure 5C:
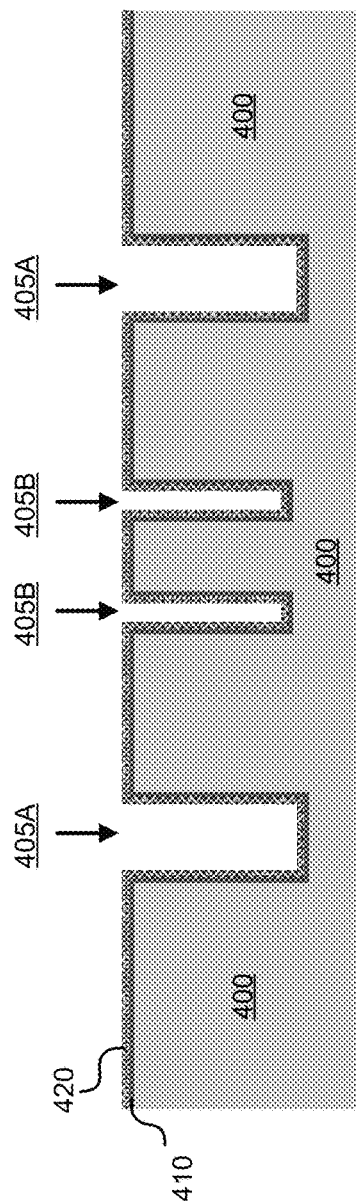
Figure 5D:
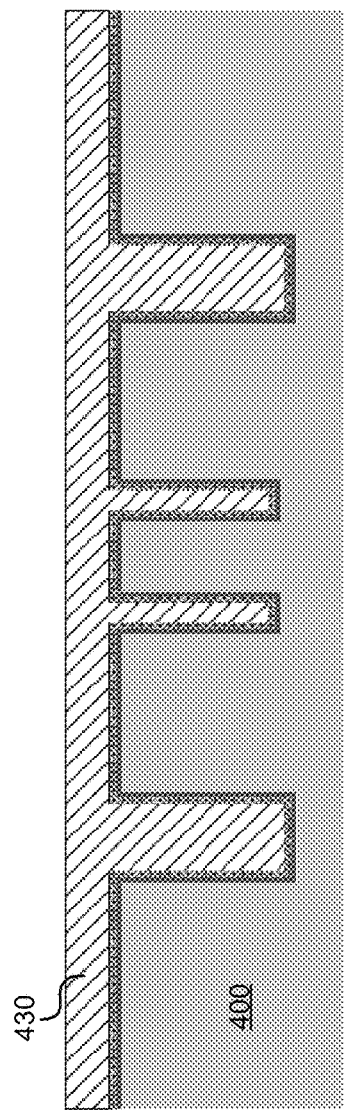

FIG. 4 is an operational flow diagram illustrating an example process 300 for fabricating a device including a first frame coupled to a second frame by one or more conductive flexures (e.g., metal flexures) with ends embedded in the frames. FIGS. 5A-5H are cross-sectional diagrams illustrating the device after various process operations and will be described in conjunction with FIG. 4. For simplicity, some process operations may be omitted and some of the deposited layers may not be shown in the figures.

Prior to beginning process 300, a substrate 400 (e.g., a silicon substrate) may be provided. Substrate 400 may have had prior features formed on it, such as, for example, features corresponding to an outer frame and features corresponding to an inner frame (e.g., a moving stage). With reference now to process 300, at operation 302, trenches 405A and 405B are fabricated in substrate 400. In one embodiment, the trenches in the substrate may be formed by a deep reactive ion etching (DRIE) process.

As shown in this example, trenches 405A and 405B are formed. As will be further described below, each trench 405A may correspond to the ends of the conductive flexure (e.g., one end bonded to an inner frame and one end bonded to an outer frame) and each trench 405B may correspond to the body of the conductive flexure. In embodiments, the aspect ratio (depth/width ratio) of formed trenches 405B may vary depending on the conductivity, flexibility, and space requirements of the formed flexures. For example, where multiple conductive flexures are formed, trenches of varying aspect ratios or the same aspect ratio may be formed. In particular embodiments, the trenches may have a depth (height of flexure) in the range of 5 μm to 50 μm and a width (width of flexure) in the range of 0.5 μm to 10 μm.

Following formation of the trenches in the substrate, at operation 304, oxide and polysilicon films 410 are grown or deposited on the surface substrate. The thickness of the polysilicon layer may be adjusted to tune the width of trenches to a required range. In particular embodiments, the total thickness of the oxide and polysilicon films may be between 100 nm and 2 μm. At operation 306, a barrier metal layer (e.g., Ta, TaN, TiN, Ti) followed by a seed layer 420 are deposited over the substrate in preparation for plating. In embodiments, the seed layer may comprise any material having sufficient conductivity and capable of serving layer for the plated materials. For example, the seed layer may be a copper seed layer.

The trenches may then be plated at operation 308 with a conductive material to form a flexure layer 430. In a particular embodiment, the conductive material may comprise copper or a copper alloy, which has high conductivity, high strength, and is inexpensive. However, in alternative embodiments other conductive materials that provide high flexure strength and conductivity may be used. For example, silver (Ag), gold (Au), aluminum (Al), or other conductive metals, metal alloys or materials may be used as a plating material. In one embodiment, the trenches are plated by applying an electroplating process to ensure that the trenches are filled with the conductive material (e.g., Cu) without any voids.

Following plating of the conductive material, at operation 310, excess conductive material outside of the trenches is removed from the substrate. For example, in one embodiment, excess conductive material is removed by applying a planarization process such as chemical mechanical planarization (CMP) process. Alternatively, in other embodiments the excess conductive material may be removed by applying an etching process.

At operation 312, a lithography patterning process is applied to pattern the flexures. As illustrated in the example of FIG. 5F, a photoresist pattern layer 440 is deposited over the substrate. In various embodiments, photoresist pattern layer 440 has a pattern corresponding to the shape of one or more flexures. Additionally, a hard mask layer (not shown) such as a layer of tantalum (Ta) or chromium (Cr) may be deposited over the photoresist pattern layer.

Following the lithography patterning process, at operation 314 the exposed substrate material 400 (e.g., silicon) is removed as shown in FIG. 5G. In various embodiments, the substrate material may be removed by applying an etching process such as an isotropic etching process. The photo resist pattern layer 440 may then be removed (e.g., by oxygen plasma stripping).

As illustrated by FIGS. 5G-5H, following removal of the substrate material, all substrate material around the body of the one or more conductive flexures has been removed. In other words, all conductive flexures are now free-standing (i.e., released from the substrate) and connected to a first frame (e.g., electrical bars) and second frame (e.g., moving stage) by the embedded ends. As shown in the embodiment of FIG. 5H, a first end 430A is embedded in first frame 400A, and a second end 430B is embedded in a second frame 400B. The body 430C-D of the flexure is released and electrically and mechanically couples the two frames together. Following formation of the conductive flexures, additional process operations may be performed on the assembly, such as, for example, connecting the embedded ends of each of the flexures to electrical contact pads formed on or coupled to the surface of the first and second frames, respectively.

Figure 6A:
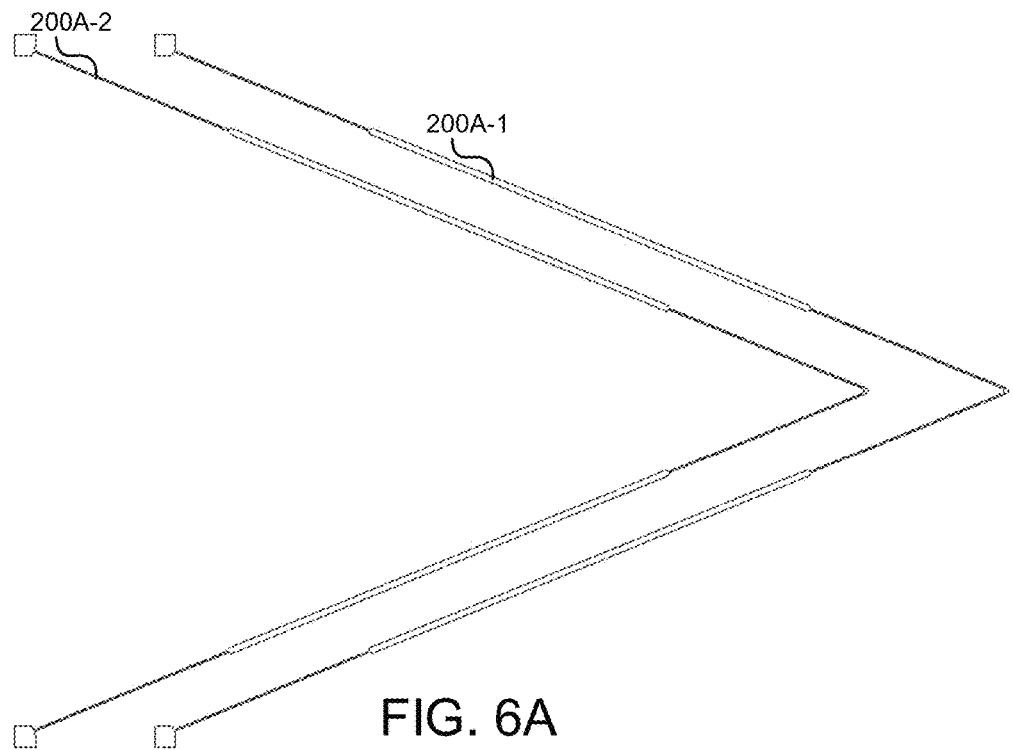
FIG. 6A is an example model illustrating adjacent electric connection flexures of a moving stage when the moving stage is at rest, in accordance with embodiments of the technology disclosed herein.
Figure 6B:
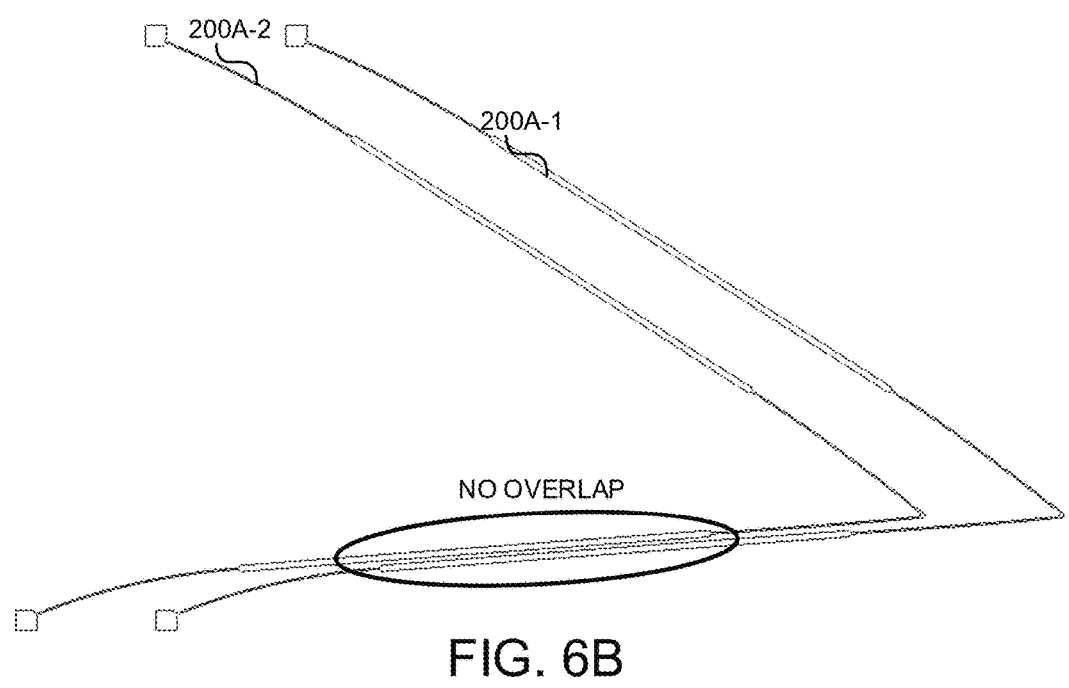
FIG. 6B is an example model illustrating adjacent electric connection flexures of a moving stage when the moving stage reaches a maximum displacement in a plane of movement, in accordance with embodiments of the technology disclosed herein.

As noted above, in embodiments the conductive flexures may be designed to prevent contact with adjacent conductive flexures during maximum displacement or travel of the moving stage or frame they are coupled to. Accordingly, wire interference may be prevented. FIGS. 6A-6B are models illustrating an example where adjacent conductive flexures 200A-1 and 200A-2 do not contact one another during maximum displacement of a moving stage. FIG. 6A illustrates flexures 200A-1 and 200A-2 when the moving stage is at rest. The flexures are parallel along the length of their bodies. FIG. 6B illustrates flexures 200A-1 and 200A-2 when the moving stage reaches a maximum displacement in both the X and Y directions. There is a small gap (i.e., no overlap) in the section of flexures 200A-1 and 200A-2 that are closest to each other.

Figure 7:
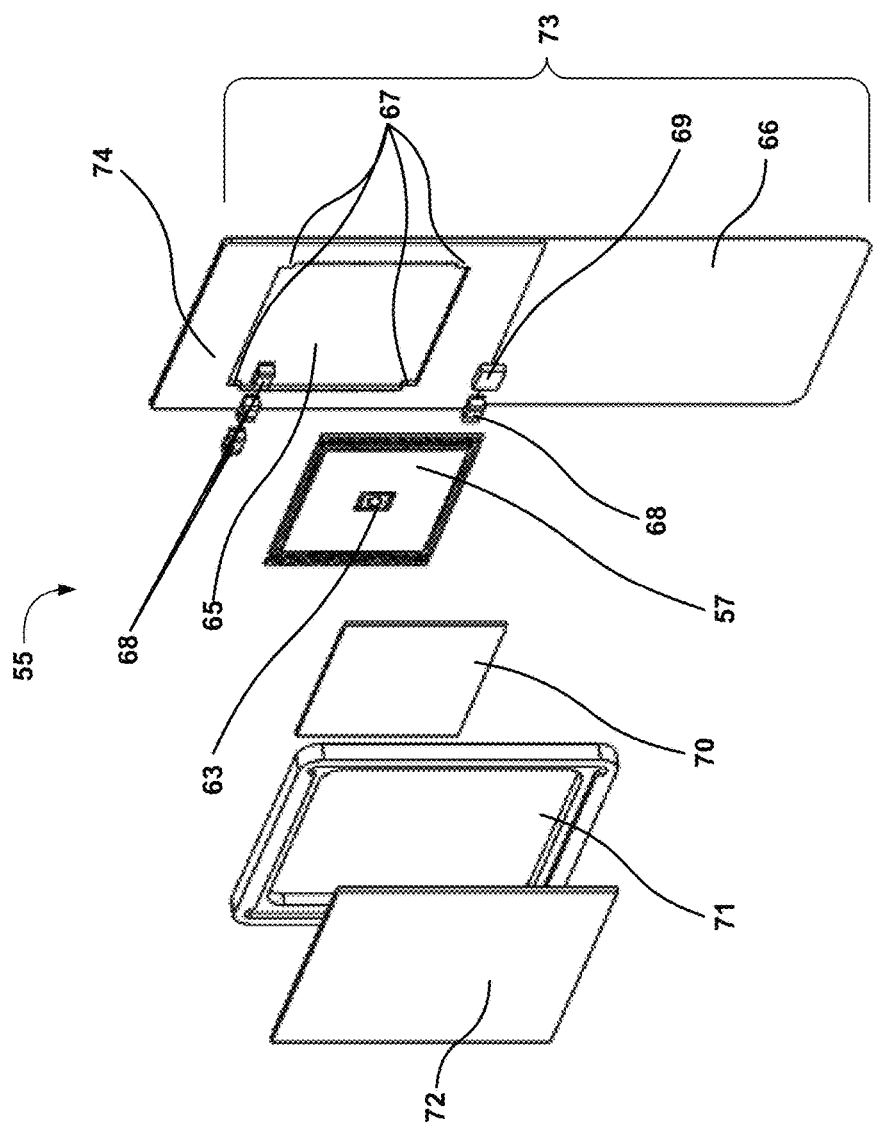
FIG. 7 is an exploded perspective view of an example image sensor package utilized in accordance with various embodiments of the disclosed technology.

FIG. 7 is an exploded perspective view illustrating an assembled moving image sensor package 55 that may use the flexures described herein in accordance with one embodiment. In embodiments, moving image sensor package 55 may be a component of a miniature camera (e.g., a miniature camera for a mobile device). Moving image sensor package 55 can include, but is not limited to the following components: a substrate 73; a plurality of capacitors and/or other passive electrical components 68; a MEMS actuator driver 69; a MEMS actuator 57; an image sensor 70; an image sensor cap 71; and an infrared (IR) cut filter 72. Substrate 73 can include a rigid circuit board 74 with a recess 65 and in-plane movement limiting features 67, and a flexible circuit board acting as a back plate 66. The rigid circuit board 74 may be constructed out of ceramic or composite materials such as those used in the manufacture of plain circuit boards (PCB), or some other appropriate material(s). Moving image sensor package 55 may include one or more drivers 69.

Since the thermal conduction of air is roughly inversely proportional to the gap, and the image sensor 70 can dissipate a substantial amount of power between 100 mW and 1 W, the gaps between the image sensor 70, the stationary portions of the MEMS actuator 57, the moving portions of the MEMS actuator 57, and the back plate 66 are maintained at less than approximately 50 micrometers. In one embodiment, the back plate 66 can be manufactured out of a material with good thermal conduction, such as copper, to further improve the heat sinking of the image sensor 70. In one embodiment, the back plate 66 has a thickness of approximately 50 to 100 micrometers, and the rigid circuit board 74 has a thickness of approximately 150 to 200 micrometers.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. An actuator, comprising:
   an outer frame;
   an inner frame; and
   a flexure electrically and mechanically coupling the outer frame to the inner frame, wherein the flexure comprises at least one of a metal and a metal alloy, wherein the flexure comprises:
      a first end embedded in the outer frame;
      a second end embedded in the inner frame; and
      a body extending from the first end to the second end, wherein the body of the flexure has a V-shape formed by a first straight section extending from the first end at an angle, a second straight section extending from the second end at an angle and coupled to the first straight section, wherein each of the first and second straight sections comprise:
         a first thin section extending from a respective end of the flexure;
         a thicker section extending from the first thin section; and
         a second thin section extending from the thicker section.

2. The actuator of claim 1, wherein the outer frame and inner frame comprise silicon, wherein the first end is embedded in the silicon of the outer frame, and wherein the second end is embedded in the silicon of the inner frame.

3. The actuator of claim 2, further comprising: a circuit board and a sensor, wherein the outer frame is bonded on the circuit board, wherein the inner frame is electrically and mechanically coupled to a moving stage including the sensor, and wherein the sensor is electrically connected to the circuit board by the flexure.

4. The actuator of claim 1, wherein the body of the flexure ranges from about 5 to 50 micrometers in height, about 0.5 to 20 micrometers wide, and about 5 to 500 micrometers in a plane of motion.

5. A metal flexure for a moving platform, comprising:
   a first end;
   a second end;
   a body extending from the first end to the second end, wherein the body is flexible in a plane of motion, wherein the body ranges from about 5 to 50 micrometers in height, about 0.5 to 20 micrometers wide, and about 5 to 500 micrometers in the plane of motion, wherein the body of the flexure has a V-shape formed by a first straight section extending from the first end at an angle, a second straight section extending from the second end at an angle and coupled to the first straight section, wherein each of the first and second straight sections comprise:
      a first thin section extending from a respective end of the flexure;
      a thicker section extending from the first thin section; and
      a second thin section extending from the thicker section.

* * * * *